US011380380B2

(12) United States Patent
Disegni et al.

(10) Patent No.: US 11,380,380 B2
(45) Date of Patent: Jul. 5, 2022

(54) NON VOLATILE MEMORY DEVICE WITH AN ASYMMETRIC ROW DECODER AND METHOD FOR SELECTING WORD LINES

(71) Applicant: STMicroelectronics S.r.l., Agrate Brianza (IT)

(72) Inventors: Fabio Enrico Carlo Disegni, Spino d'adda (IT); Maurizio Francesco Perroni, Messina (IT); Cesare Torti, Pavia (IT); Guiseppe Scardino, Poggioreale (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 60 days.

(21) Appl. No.: 17/088,060

(22) Filed: Nov. 3, 2020

(65) Prior Publication Data

US 2021/0166745 A1 Jun. 3, 2021

(30) Foreign Application Priority Data

Nov. 14, 2019 (IT) .......................... 102019000021165

(51) Int. Cl.
*G11C 8/10* (2006.01)
*G11C 8/08* (2006.01)

(52) U.S. Cl.
CPC . *G11C 8/10* (2013.01); *G11C 8/08* (2013.01)

(58) Field of Classification Search
CPC ......... G11C 8/10; G11C 8/08; G11C 13/0028; G11C 16/08; G11C 13/0004; G11C 16/0483; G11C 16/10; G11C 16/24
See application file for complete search history.

(56) References Cited

U.S. PATENT DOCUMENTS

| | | | |
|---|---|---|---|
| 5,854,770 A | 12/1998 | Pascucci | |
| 2003/0128581 A1* | 7/2003 | Scheuerlein | ........ H01L 27/1021 257/E27.073 |
| 2004/0057278 A1* | 3/2004 | Fujita | ...................... G11C 11/16 365/158 |
| 2008/0310229 A1* | 12/2008 | Hamada | ................... G11C 8/08 365/189.11 |
| 2010/0226179 A1 | 9/2010 | Kim | |
| 2019/0206488 A1 | 7/2019 | Conte | |

* cited by examiner

*Primary Examiner* — Jay W. Radke
(74) *Attorney, Agent, or Firm* — Slater Matsil, LLP

(57) ABSTRACT

A non-volatile memory device including an array of memory cells coupled to word lines and a row decoder, which includes a first and a second pull-down stage, which are arranged on opposite sides of the array, and include, respectively, for each word line, a corresponding first pull-down switching circuit and a corresponding second pull-down switching circuit, which are coupled to a first point and a second point, respectively, of the first word line. The row decoder moreover comprises a pull-up stage, which includes, for each word line, a corresponding pull-up switching circuit, which can be electronically controlled in order to: couple the first point to a supply node in the step of deselection of the word line; and decouple the first point from the supply node in the step of selection of the word line.

20 Claims, 10 Drawing Sheets

NON VOLATILE MEMORY DEVICE WITH AN ASYMMETRIC ROW DECODER AND METHOD FOR SELECTING WORD LINES

CROSS-REFERENCE TO RELATED APPLICATIONS

This application claims the benefit of Italian Application No. 102019000021165, filed on Nov. 14, 2019, which application is hereby incorporated herein by reference.

TECHNICAL FIELD

The present invention relates to a non-volatile memory device, which includes an asymmetrical row decoder, and to a method for selecting word lines.

BACKGROUND

As is known, various types of non-volatile memories are today available, such as phase-change memories (PCMs), where the characteristics of materials having the property of switching between phases with a different electrical behaviour are exploited for storing information. These materials can switch between a disorderly, amorphous, phase and an orderly, crystalline or polycrystalline, phase; different phases are characterized by different values of resistivity and are consequently associated to different values of a datum stored. For instance, the elements of Group VI of the periodic table, such as tellurium (Te), selenium (Se), or antimony (Sb), also known as chalcogenides or chalcogenic materials, can be used for manufacturing phase-change memory cells; in particular, an alloy formed by germanium (Ge), antimony (Sb), and tellurium (Te), known as GST (having the chemical composition $Ge_2Sb_2Te_5$), is currently widely used in such memory cells.

The phase changes can be obtained by locally increasing the temperature of the cells of chalcogenic material, through resistive electrodes (in general known as "heaters") set in contact with corresponding regions of chalcogenic material.

Access (or selection) devices, for example bipolar or MOS transistors, are connected to the heaters and selectively enable passage of a programming electric current (also known as writing electric current) through them; this electric current, by the Joule effect, generates the heat required for phase change, and in particular for switching from a high-resistivity state (known as RESET state) to a low-resistivity state (the so-called SET state), or vice versa.

During reading, the state of the chalcogenic material is detected by applying a voltage that is sufficiently low as not to cause a sensible heating thereof, and then reading the value of the current that flows in the memory cell through a sense amplifier. Given that the current is proportional to the conductivity of the chalcogenic material, it is possible to determine in which state the material is and consequently determine the datum stored in the memory cell.

This having been said, FIG. 1 shows that, in general, a non-volatile memory device 1 comprises a memory array 2 formed by a plurality of memory cells 3, arranged in rows, or word lines WL, and columns, or bit lines, the latter being also known as "local bit lines LBL".

Each memory cell 3 is formed by a storage element 3a and by an access element 3b, which are connected in series between a respective local bit line LBL and a terminal at the reference potential (for example, ground, GND). A word line WL is defined by the set of all the control terminals of the access elements 3b aligned along a same row.

The storage element 3a includes an element of phase-change material (for example, a chalcogenide, such as GST) and is consequently able to store data in the form of levels of resistance associated to the different phases assumed by the material itself.

The access element 3b is, for example, a bipolar transistor, the base terminal of which is connected to a respective word line WL. In addition, the emitter terminal is connected to a first terminal of the storage element 3a, while the collector terminal is connected to the terminal at the reference potential. A second terminal of the storage element 3a is connected to a corresponding local bit line LBL. The access element 3b is controlled and biased so as to enable, when selected, passage of a reading current, or else of a writing current, through the storage element 3a.

A column decoder 4 and a row decoder 5 enable selection of the memory cells 3, on the basis of address signals received at input (designated as a whole by AS) and more or less complex decoding schemes. The address signals AS can be generated by a control logic CL, which moreover governs the column decoder 4 and the row decoder 5 so as to enable reading and writing (SET and RESET) of the memory cells 3 addressed by the address signals AS. Albeit not illustrated, the control logic CL supplies to the column decoder 4 and to the row decoder 5 also control signals in order to control the aforementioned reading/writing operations.

In particular, the column decoder 4 and the row decoder 5 enable selection of the word lines WL and of the local bit lines LBL each time addressed, and therefore enable biasing at appropriate voltage values of the word lines WL and local bit lines LBL selected.

The column decoder 4 is moreover configured to implement internally two distinct paths towards the local bit lines LBL of the memory array 2 each time selected: a reading path, designed to create selectively a conductive path between each selected local bit line LBL and a reading stage 7, which includes a plurality of sense amplifiers; and a writing path, designed to create selectively a conductive path between each selected local bit line LBL and a writing stage 8 configured to supply the currents required for the writing operations, i.e., for the so-called programming of the memory cells in corresponding logic states, and therefore for storage of information. For this purpose, the column decoder 4 comprises, for each reading and programming path, appropriate selection elements (in particular, controlled transistors), connected so as to implement an address-decoding system, which is typically hierarchical, for selection of the memory cells 3.

SUMMARY

In greater detail, various circuit architectures are known that enable implementation of the row decoder 5. Typically, as is shown in FIGS. 2A and 2B, the row decoder 5 comprises a right-hand circuitry 10R and a left-hand circuitry 10L, which are arranged respectively to the right and to the left of the memory array 2. For reasons of simplicity, in FIGS. 2A and 2B the memory array 2 is represented qualitatively, without showing either the memory cells 3 or the local bit lines LBL, and moreover showing only, by way of example, eight word lines WL adjacent to one another (designated, respectively, by WL<0>, . . . , WL<7>). In this connection, it is assumed that the eight word lines WL<0>, . . . , WL<77> and the memory cells 3 connected thereto form a sub-portion 6 (i.e., a subarray) of the memory array 2, the latter including a plurality of sub-portions 6 (only one of which may be seen in FIGS. 2A and 2B).

In what follows, the row decoder 5 is described with reference to the part coupled to the only sub-portion 6 shown in FIGS. 2A and 2B, except where otherwise specified. Moreover, for brevity, just the left-hand circuitry 10L is described, except where otherwise specified, and it is anticipated that the right-hand circuitry 10R is the same as and symmetrical to the left-hand circuitry 10L, but for the differences described hereinafter. Corresponding components of the left-hand circuitry 10L and of the right-hand circuitry 10R are designated by the same references, but for the final letter, which is "L" for the case of the left-hand circuitry 10L and "R" for the case of the right-hand circuitry 10R, as well as being denoted by the same terms, except for the adjective, which is "left-hand" and "right-hand", respectively.

In detail, the left-hand circuitry 10L comprises a first left-hand pre-selection transistor LY_NL and a second left-hand pre-selection transistor LX_NL, which are N-channel enhancement MOSFETs, which are the same as one another and are connected in series. In particular, the source terminal of the first left-hand pre-selection transistor LY_NL is connected to ground. Moreover, the source terminal of the second left-hand pre-selection transistor LX_NL is connected to the drain terminal of the first left-hand pre-selection transistor LY_NL. The drain terminal of the second left-hand pre-selection transistor LX_NL defines a left-hand common node NL.

The left-hand circuitry 10L further comprises a left decoder branch 12L for each word line WL<0>-WL<7>. In turn, each left decoder branch 12L comprises a respective left-hand bottom cascode transistor 14L and a respective left-hand selection transistor 16L, which are N-channel enhancement MOSFETs and are, for example, the same as the first and second left-hand pre-selection transistors LY_NL, LX_NL. The source terminal of the left-hand selection transistor 16L is connected to the left-hand common node NL, which, as has been said, is associated to the sub-portion 6. Moreover, the drain terminal of the left-hand selection transistor 16L is connected to the source terminal of the left-hand bottom cascode transistor 14L, the drain terminal of which is connected, in turn, to the corresponding word line WL.

As a whole, the left-hand decoding branches 12L of the left-hand circuitry 10L form a left-hand pull-down stage 15L, which, from a circuit standpoint, is the same as the right-hand pull-down stage 15R of the right-hand circuitry 10R and is coupled to the sub-portion 6.

The left-hand circuitry 10L further comprises a respective left-hand pull-up stage 18L, which includes four left-hand pull-up circuits 20L (just two of which may be seen in FIGS. 2A and 2B).

In detail, each left-hand pull-up circuit 20L comprises a respective left-hand top cascode transistor 22L, a respective left-hand biasing transistor 24L, and a respective left-hand deselection transistor 26L, which are P-channel enhancement MOSFETs and are the same as one another. The source terminals of the left-hand biasing transistor 24L and of the left-hand deselection transistor 26L are connected to a supply terminal, which in use is set at a supply voltage $V_{DD}$ (for example, equal to 1.8 V in the reading step and to 4.8 V in the writing step). The drain terminals of the left-hand biasing transistor 24L and of the left-hand deselection transistor 26L are connected to the source terminal of the left-hand top cascode transistor 22L, the drain terminal of which is connected to a corresponding word line of the word lines WL<0>, WL<2>, WL<4>, and WL<6>.

As is shown in FIG. 4A, the left-hand biasing transistors 24L (only one of which may be seen in FIG. 4A) form a left-hand current mirror 25L, since their gate terminals are connected to the gate terminal of a left-hand mirror transistor 29L (which is a P-channel enhancement MOSFET), the source terminal of which is set at the supply voltage $V_{DD}$, and the gate terminal of which is connected to the drain terminal, which in turn is connected to a left-hand current generator 31L, which generates a current $I_{charge}$, which is mirrored in the left-hand biasing transistors 24L. In addition, on the gate terminals of the left-hand deselection transistors 26L a signal DESELECT_L is present, described hereinafter.

The right-hand pull-up stage 18R of the right-hand circuitry 10R is the same as the left-hand pull-down stage 18L of the left-hand circuitry 10L, but for the fact that the drain terminals of the right-hand top cascode transistors 22R are each connected to a corresponding word line of the word lines WL<1>, WL<3>, WL<5>, and WL<7>. Albeit not shown, the right-hand biasing transistors 24R form a right-hand current mirror (not shown). Moreover, on the gate terminals of the right-hand deselection transistors 26R, a signal DESELECT_R is present, described hereinafter.

The gate terminals of the left-hand bottom cascode transistors 14L of the left-hand circuitry 10L and the gate terminals of the right-hand bottom cascode transistors 14R of the right-hand circuitry 10R are set at a first cascode voltage VCASC (for example, equal to 1.8 V in the reading step and to 2.4 V in the writing step).

The gate terminals of the left-hand top cascode transistors 22L of the left-hand circuitry 10L and the gate terminals of the right-hand top cascode transistors 22R of the right-hand circuitry 10R are set at a second cascode voltage VCASC_P (equal, for example, to 0 V in the reading step and to 2.4 V in the writing step).

In practice, the row decoder 5 comprises, for each sub-portion 6 (one of which is visible in FIGS. 2A and 2B) of the memory array 2, a corresponding left-hand pull-down stage 15L of the left-hand circuitry 10L (one of which is visible in FIG. 2A) and a corresponding right-hand pull-down stage 15R (one of which is visible in FIG. 2B) of the right-hand circuitry 10R, which define, respectively, a corresponding left-hand common node NL (one of which is visible in FIG. 2A) and a corresponding right-hand common node NR (one of which is visible in FIG. 2B). Moreover, each left-hand pull-down stage 15L is coupled to a corresponding second left-hand pre-selection transistor LX_NL. Likewise, each right-hand pull-down stage 15R is coupled to a corresponding second right-hand pre-selection transistor LX_NR.

In addition, the sub-portions 6 are gathered in groups of sub-portions 6 (one of which is visible in FIGS. 2A and 2B, designated by 7), each of which includes a pre-set number of sub-portions 6 (for example, eight).

For each group 7, the row decoder 5 comprises a corresponding first left-hand pre-selection transistor LY_NL (one of which is shown in FIG. 2A), the drain terminal of which is connected to the source terminals of the eight second left-hand pre-selection transistors LX_NL (one of which is shown in FIG. 2A), the drain terminals of which are respectively connected to the eight left-hand common nodes NL corresponding to the eight sub-portions 6. Moreover, for each group 7, the row decoder 5 comprises a corresponding first right-hand pre-selection transistor LY_NR (one of which is shown in FIG. 2B), the drain terminal of which is connected to the source terminals of the eight second right-hand pre-selection transistors LX_NR (one of which is shown in FIG. 2B), the drain terminals of which are respectively connected to the eight right-hand common nodes NR corresponding to the eight sub-portions 6.

In practice, the first and second left-hand and right-hand pre-selection transistors enable selection of any sub-portion 6 of the memory array 2, as explained hereinafter. Moreover, the ensemble of the first and second left-hand pre-selection transistors LY_NL, LX_NL and of the left-hand pull-down stages 15L forms a left-hand local selection stage, whereas the ensemble of the first and second right-hand pre-selection transistors LY_NR, LX_NR and of the right-hand pull-down stages 15R forms a right-hand local selection stage.

As shown in FIG. 3, the row decoder 5 further comprises a pre-decoding stage 30, which generates, on the basis of the address signals AS, the signals sLY<7:0>, the signals sLX<7:0>, and the signals PX<7:0>, which enable implementation of a hierarchical structure for selecting the word lines WL. In particular, this example regards the case where the memory array 2 comprises eight groups 7, each of which comprises eight sub-portions 6, each of which, in turn, comprises eight respective word lines WL. It is moreover anticipated that the decoding stage 30 also generates the signals DESELECT_L<7:0> and DESELECT_R<7:0>, described hereinafter.

In greater detail, the signals sLY<7:0> and sLX<7:0> enable selection of one of the sixty-four sub-portions 6 of the memory array 2, whereas the signals PX<7:0> enable selection of one of the eight word lines WL of the selected sub-portion 6.

In particular, the decoding stage 30 applies the i-th signal sLY<i> (with i=0, 1, . . . , 7) on the gate terminals of the pair formed by the first left-hand pre-selection transistor LY_NL and by the first right-hand pre-selection transistor LY_NR of the i-th group 7. Moreover, in each of the eight groups 7, the decoding stage 30 applies the j-th signal sLX<j> (with j=0, 1, . . . , 7) on the gate terminals of the pair formed by the j-th second left-hand pre-selection transistor LX_NL and by the j-th second right-hand pre-selection transistor LX_NR. In other words, in each group 7, the j-th signal sLX<j> is supplied to the second pre-selection transistors corresponding to the j-th sub-portion 6. In addition, for each of the sixty-four sub-portions 6, the decoding stage 30 applies the m-th signal PX<m> (with m=0, 1, . . . , 7) on the gate terminals of the left-hand selection transistor 16L of the m-th left-hand decoding branch 12L and of the right-hand selection transistor 16R of the m-th right-hand decoding branch 12R; in other words, in each sub-portion 6, the m-th signal PX<m> is supplied to the second selection transistors corresponding to the m-th word line WL<m>.

In use, the pre-decoding stage 30 activates (by setting it equal to the logic value '1', instead of '0') just one of the eight signals sLY<7:0> at a time, as well as just one of the eight signals sLX<7:0> at a time and just one of the eight signals PX<7:0> at a time. In this way, designating by sLY<i*>, sLX<j*>, and PX<m*> just the active signals sLY, sLX and PX, respectively, we find that:

- of the first left-hand and right-hand pre-selection transistors LY_NL, LY_NR, only the two transistors that receive on their own gate terminals the signal sLY<i*> are in conduction, this being equivalent to selecting the i*-th group 7;
- of the second left-hand and right-hand pre-selection transistors LX_NL, LX_NR, only the two transistors that receive on their own gate terminals the signal sLX<j*> are in conduction, this being equivalent to selecting, within the i*-th group 7, the j*-th sub-portion 6, which is connected, through the respective left-hand and right-hand pull-down stages 15L, 15R, to the pair of transistors;
- of the left-hand selection transistors 16L of the left-hand pull-down stage 15L corresponding to the j*-th sub-portion 6 of the i*-th group 7, only the left-hand selection transistor 16L that receives on its own gate terminal the signal PX<m*> is in conduction, together with the corresponding left-hand bottom cascode transistor 14L; and
- of the right-hand selection transistors 16R of the right-hand pull-down stage 15R corresponding to the j*-th sub-portion 6 of the i*-th group 7, only the right-hand selection transistor 16R that receives on its own gate terminal the signal PX<m*> is in conduction, together with the corresponding right-hand bottom cascode transistor 14L.

In practice, the signals sLY<i*>, sLX<j*>, and PX<m*> enable selection of the m*-th word line WL<m*> of the j*-th sub-portion 6 of the i*-th group 7, which is connected to ground by a first conductive path and a second conductive path arranged symmetrically at the ends of the word line WL<m*>. The first conductive path includes: the first left-hand pre-selection transistor LY_NL, which receives on its own gate terminal the signal sLY<i*>; the second left-hand pre-selection transistor LX_NL, which is coupled to the first left-hand pre-selection transistor LY_NL and receives on its own gate terminal the signal sLX<j*>; and the left-hand selection transistor 16L of the left-hand pull-down stage 15L corresponding to the selected sub-portion 6, which receives on its own gate terminal the signal PX<m*>, in addition to the corresponding left-hand bottom cascode transistor 14L. Likewise, the second conductive path includes: the first right-hand pre-selection transistor LY_NR, which receives on its own gate terminal the signal sLY<i*>; the second right-hand pre-selection transistor LX_NR, which is coupled to the first right-hand pre-selection transistor LY_NR and receives on its own gate terminal the signal sLX<j*>; and the right-hand selection transistor 16R of the right-hand pull-down stage 15R corresponding to the selected sub-portion 6, which receives on its own gate terminal the signal PX<m*>, in addition to the corresponding right-hand bottom cascode transistor 14L.

The first and second conductive paths therefore enable connection to ground of the selected word line WL, in a symmetrical way. In this way, the differences in voltage to which the base terminals of the bipolar transistors that form the access elements 3b coupled to the selected word line WL are inevitably subject are reduced, on account of the current that flows in the selected word line WL. Instead, the non-selected word lines WL are disconnected from ground and, as explained hereinafter, are set at a voltage that corresponds to a high logic level.

An example of selection of the word line WL<0> of the j*-th sub-portion 6 of the i*-th group 7 is shown in FIG. 4A, where it is highlighted how, in the left-hand pull-up circuit 20L coupled to the word line WL<0>, the left-hand deselection transistor 26L receives on its own gate terminal the signal DESELECT_L<i*>, which has a high logic value, so that within the left-hand deselection transistor 26L no current flows. It is therefore found that the current $I_{charge}$ flows in the left-hand biasing transistor 24L, in the corresponding left-hand top cascode transistor 22L, in the selection transistor 16L the gate terminal of which receives the signal PX<0>, and in the corresponding left-hand bottom cascode transistor 14L, as well as in the first left-hand pre-selection transistor LY_NL that receives the signal sLY<i*> and in the second left-hand pre-selection transistor LX_NL, which is coupled to the latter and receives the signal sLX<j*>; in this way, the word line WL<0> is at a low voltage, since it is connected to ground.

In greater detail, albeit not visible in FIG. 4A, the gate terminals of all the left-hand deselection transistors 26L of the left-hand pull-up circuits 20L of the i-th group 7 receive a same signal DESELECT_L<i>, which coincides with the signal DESELECT_R<i> present on the gate terminals of the right-hand deselection transistors 26R of the right-hand pull-up circuits 20R of the group 7. Moreover, with reference to the signals sLY<i> and DESELECT_L<i> (the latter being equal to DESELECT_R<i>), these assume a same logic value. Consequently, in the case of selection of the m*-th word line WL<m*> of the j*-th sub-portion 6 of the i*-th group 7, the word lines of the j*-th sub-portion 6 of the i*-th group 7 different from the m*-th word line WL<m*> are deselected because they are at a high voltage on account of inhibition of the corresponding left-hand and right-hand selection transistors 16L, 16R and on account of their coupling to the supply terminal through the corresponding biasing transistor (either the left-hand one 24L or the right-hand one 24R, according to whether it is an even word line or an odd word line).

In the case (shown, for example, in FIG. 4B) of an i-th non-selected group 7, the signal sLY<i> is low, so as to inhibit the corresponding first left-hand pre-selection transistor LY_NL and the corresponding first right-hand pre-selection transistor LY_NR. In addition, also the signal DESELECT_L<i> is low, so as to maintain the left-hand deselection transistors 26L coupled to the i-th group 7 above threshold, thus raising the voltage present on the odd word lines connected thereto. Since also the signal DESELECT_R<i> is low, also the right-hand deselection transistors 26R coupled to the i-th group 7 are above threshold, thus raising the voltage present on the even word lines connected thereto.

For instance, assuming that the word line WL<0> of the j*-th sub-portion 6 of the i*-th group 7 has been selected, FIG. 4B shows the word line WL<0> of the j*-th sub-portion 6 of the i-th group 7. It may be noted how the word line WL<0> has a high voltage, and is therefore deselected, since, even though the corresponding left-hand selection transistor 16L is above threshold, the first conductive path (and likewise, albeit not visible in FIG. 4B, also the second conductive path) is interrupted on account of inhibition of the aforementioned first left-hand pre-selection transistor LY_NL. Similar considerations apply in the case (not shown) of any deselected j-th sub-portion 6 of the (selected) i*-th group 7, the corresponding second left-hand and right-hand pre-selection transistors LX_NL, LX_NR of which are inhibited.

In practice, the pull-up stage 18R of the right-hand circuitry 10R and the pull-up stage 18L of the left-hand circuitry 10L can be controlled so as to raise the voltage of the selected word line. However, the pull-up stage 18R of the right-hand circuitry 10R and the pull-up stage 18L of the left-hand circuitry 10L form a pull-up macrostage, which is distributed in part on the right, and in part on the left, of the memory array 2, with consequent high area occupation.

The aim of the present invention is therefore to provide a row decoder that will overcome at least in part the drawbacks of the prior art.

According to the present invention, a memory device and a method for selecting word lines are provided, as defined in the annexed claims.

BRIEF DESCRIPTION OF THE DRAWINGS

For a better understanding of the present invention, preferred embodiments thereof will now be described, purely by way of example and non-limiting, with reference to the attached drawings, wherein.

DETAILED DESCRIPTION OF ILLUSTRATIVE EMBODIMENTS

The present row decoder stems from an observation of the present Applicant, who has noted how the pull-up circuits 20L, 20R can be centralized, since, unlike the left-hand and right-hand pull-down stages 15L, 15R, they do not undertake the task of discharging the word lines WL, and therefore can be arranged asymmetrically, without increasing the voltage drop on the word lines WL, when these are selected (i.e., active).

Figure 1:
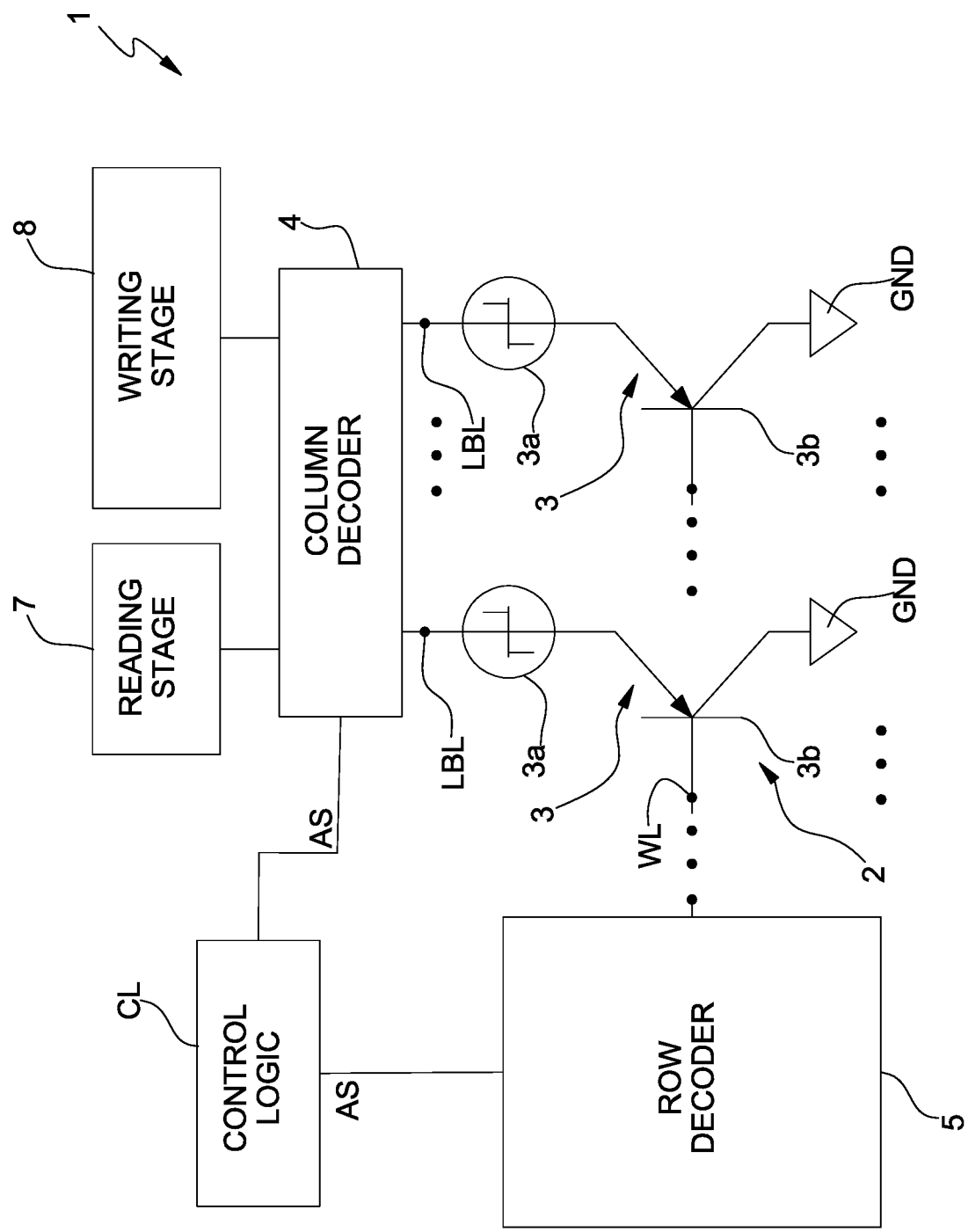
FIG. 1 shows a block diagram of a PCM device.
Figure 5:
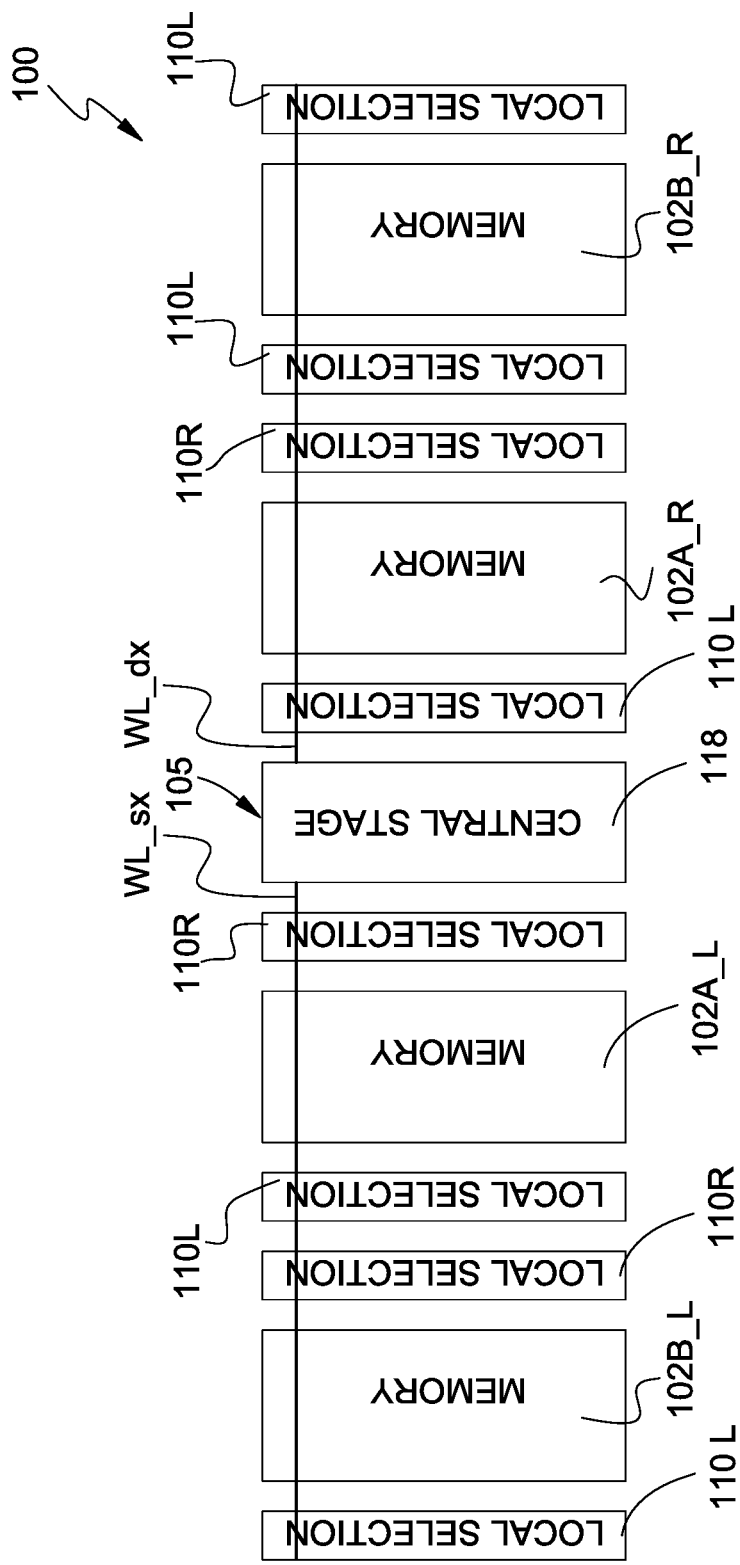
FIG. 5 shows a block diagram of an example of the present memory device.

This being said, FIG. 5 shows a non-volatile memory device 100, which includes, purely by way of example, albeit in a way not shown, memory cells of the same type as those shown in FIG. 1. Moreover, once again by way of example, the non-volatile memory device 100 includes a first right-hand memory array 102A_R and a second right-hand memory array 102B_R and a first left-hand memory array 102A_L and a second left-hand memory array 102B_L, each of which is, for example, the same as the memory array 2 described with reference to FIG. 1. As described in greater detail hereinafter, the first and second right-hand memory arrays 102A_R, 102B_R and the first and second left-hand memory arrays 102A_L, 102B_L are arranged aligned horizontally.

The non-volatile memory device 100 further comprises a row decoder 105, which in turn comprises a central deselection stage 118, which is arranged so that the first and second right-hand memory arrays 102A_R, 102B_R are arranged on the right of the central deselection stage 118, the first right-hand memory array 102A_R being interposed between the central deselection stage 118 and the second right-hand memory array 102B_R. Likewise, the first and second left-hand memory arrays 102A_L, 102B_L are arranged on the left of the central deselection stage 118, the first left-hand memory array 102A_L being interposed between the central deselection stage 118 and the second left-hand memory array 102B_L.

For each memory array, the row decoder 105 comprises a right-hand local selection stage 110R and a left-hand local selection stage 110L, which extend, respectively, on the right and on the left of the memory array. The left-hand local selection stage 110L corresponding to the first left-hand memory array 102A_L is arranged on the right of the right-hand local selection stage 110R corresponding to the second left-hand memory array 102B_L. The right-hand local selection stage 110R corresponding to the first right-hand memory array 102A_R is arranged on the left of the left-hand local selection stage 110L corresponding to the second right-hand memory array 102B_R.

Figure 7:
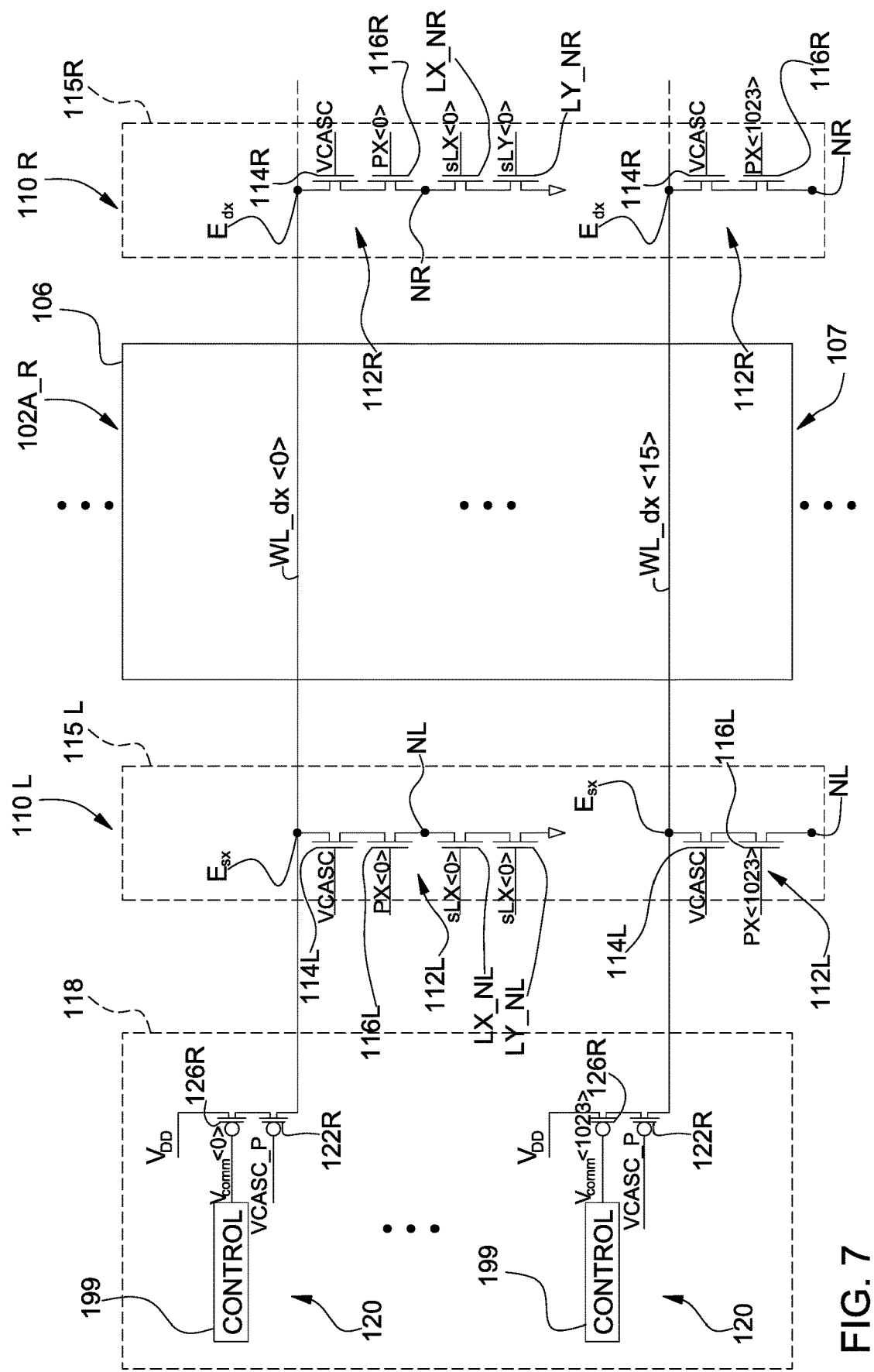
FIG. 7 shows a circuit diagram of a portion of the memory device represented in FIG. 5.

In what follows, it is assumed, for simplicity of description, that the first and second right-hand memory arrays 102A_R, 102B_R and the first and second left-hand memory arrays 102A_L, 102B_L are the same as one another. Moreover, it is assumed that each one of the first and second right-hand memory arrays 102A_R, 102B_R and the first and second left-hand memory arrays 102A_L, 102B_L comprises a same number $N_{group}$ (for example, equal to eight) of groups (designated by 107, FIG. 7) of sub-portions (designated by 106, FIG. 7), referred to hereinafter as subarrays 106. It is moreover assumed that each group 107 comprises a number $N_{array}$, for example equal to eight, of subarrays 106, each of which comprises, for example, one thousand and twenty-four word lines. Moreover, considering any subarray 106 of any one of the first and second right-hand memory arrays 102A_R, 102B_R and the first and second left-hand memory arrays 102A_L, 102B_L, the corresponding right-hand local selection stage 110R and left-hand local selection stage 110L comprise, respectively, a corresponding right-hand pull-down stage (designated by 115R, one of which is shown in FIG. 7) and a corresponding left-hand pull-down stage (designated by 115L, one of which is shown in FIG. 7), which are, for example, of the type shown in FIG. 2A and are coupled to the subarray 106 in the way shown in FIG. 2A. The components of the right-hand pull-down stage 115R and left-hand pull-down stage 115L are designated in what follows by the same reference numbers as the ones used in FIG. 2B, increased by one hundred, except for the left-hand common node and the right-hand common node, which are denoted once again by NL and NR, respectively. Moreover, considering any subarray 106 of any one of the first and second right-hand memory arrays 102A_R, 102B_R and the first and second left-hand memory arrays 102A_L, 102B_L, the corresponding right-hand local selection stage 110R comprises a number of first right-hand pre-selection transistors LY_NR equal to the number $N_{group}$ of groups 107 and, for each of the first right-hand pre-selection transistors LY_NR, a number of second right-hand selection transistors LX_NR equal to the number $N_{array}$ of subarrays 106. The connections between the right-hand pull-down stages 115R and the first and second right-hand pre-selection transistors LY_NR, LX_NR are the same as what has been described with reference to FIG. 2B. Likewise, considering any subarray 106 of any one of the first and second right-hand memory arrays 102A_R, 102B_R and of the first and second left-hand memory arrays 102A_L, 102B_L, the corresponding left-hand local selection stage 110L comprises a number of first left-hand pre-selection transistors LY_NL equal to the number $N_{group}$ of groups 107 and, for each of the first left-hand pre-selection transistors LY_NL, a number of second left-hand selection transistors LX_NL equal to the number $N_{array}$ of subarrays 106. The connections between the left-hand pull-down stages 115L and the first and second left-hand pre-selection transistors LY_NL, LX_NL are the same as what has been described with reference to FIG. 2A.

In addition, it is assumed that the first and second right-hand memory arrays 102A_R, 102B_R are traversed by, and therefore share between them, a plurality of word lines, referred to hereinafter as right-hand word lines WL_dx. It is moreover assumed that the first and second left-hand memory arrays 102A_L, 102B_L are traversed by, and therefore share between them, a plurality of further word lines, referred to hereinafter as left-hand word lines WL_sx. The right-hand word lines and the left-hand word lines extend horizontally and are stacked vertically.

Figure 6:
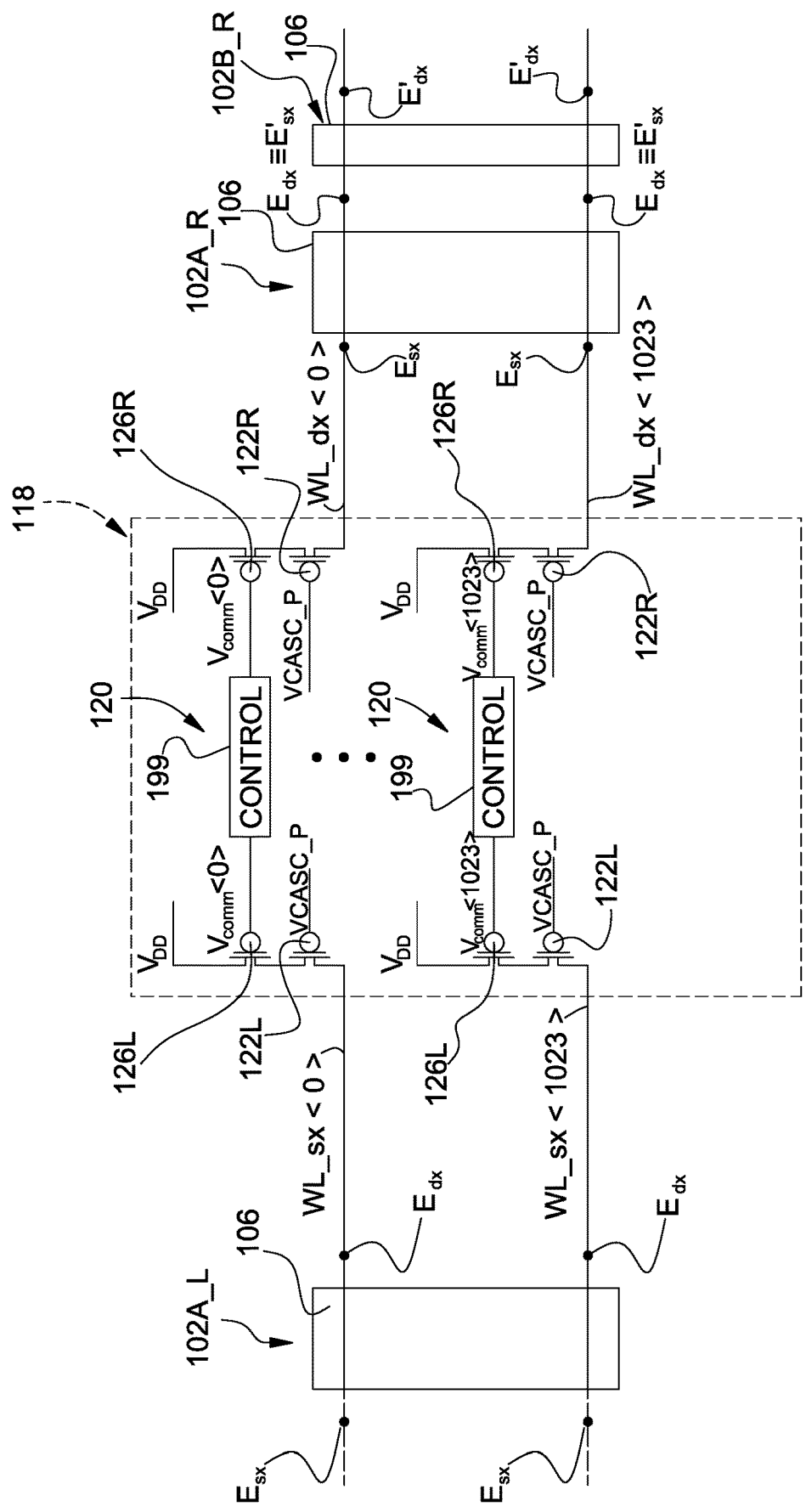
FIG. 6 shows a circuit diagram of a portion of a row decoder of the memory device represented in FIG. 5, coupled to a pair of memory arrays (represented schematically)

As shown in FIG. 6, for each sub-portion 106, the central deselection stage 118 comprises one thousand and twenty-four corresponding central pull-up circuits 120 (just two of which may be seen in FIG. 6), each of which is coupled to a corresponding pair formed by a left-hand word line WL_sx and by a corresponding right-hand word line WL_dx.

For instance, with reference to the n-th central pull-up circuit 120, it is coupled to the left-hand word line WL_sx<n> and to the right-hand word line WL_dx<n>, which extend on the left and on the right of the central pull-up circuit 120, respectively.

In greater detail, each central pull-up circuit 120 comprises a respective left-hand top cascode transistor 122L and a respective right-hand top cascode transistor 122R, which are P-channel enhancement MOSFETs and are the same as one another; in addition, each central pull-up circuit 120 comprises a respective left-hand deselection transistor 126L and a respective right-hand deselection transistor 126R, which are P-channel enhancement MOSFETs and are the same as the right-hand and left-hand top cascode transistors 122R, 122L. In addition, each central pull-up circuit 120 comprises a respective control circuit 199.

The gate terminals of the left-hand top cascode transistor 122L and of the right-hand top cascode transistor 122R are set at the second cascode voltage VCASC_P. The drain terminals of the left-hand top cascode transistor 122L and of the right-hand top cascode transistor 122R are connected to the left-hand word line WL_sx<n> and to the right-hand word line WL_dx<n>, respectively. The drain terminals of the left-hand deselection transistor 126L and of the right-hand deselection transistor 126R are connected to the source terminals of the left-hand top cascode transistor 122L and of the right-hand top cascode transistor 122R, respectively. Moreover, the source terminals of the left-hand deselection transistor 126L and of the right-hand deselection transistor 126R are connected to the supply voltage $V_{DD}$.

Figure 2A:
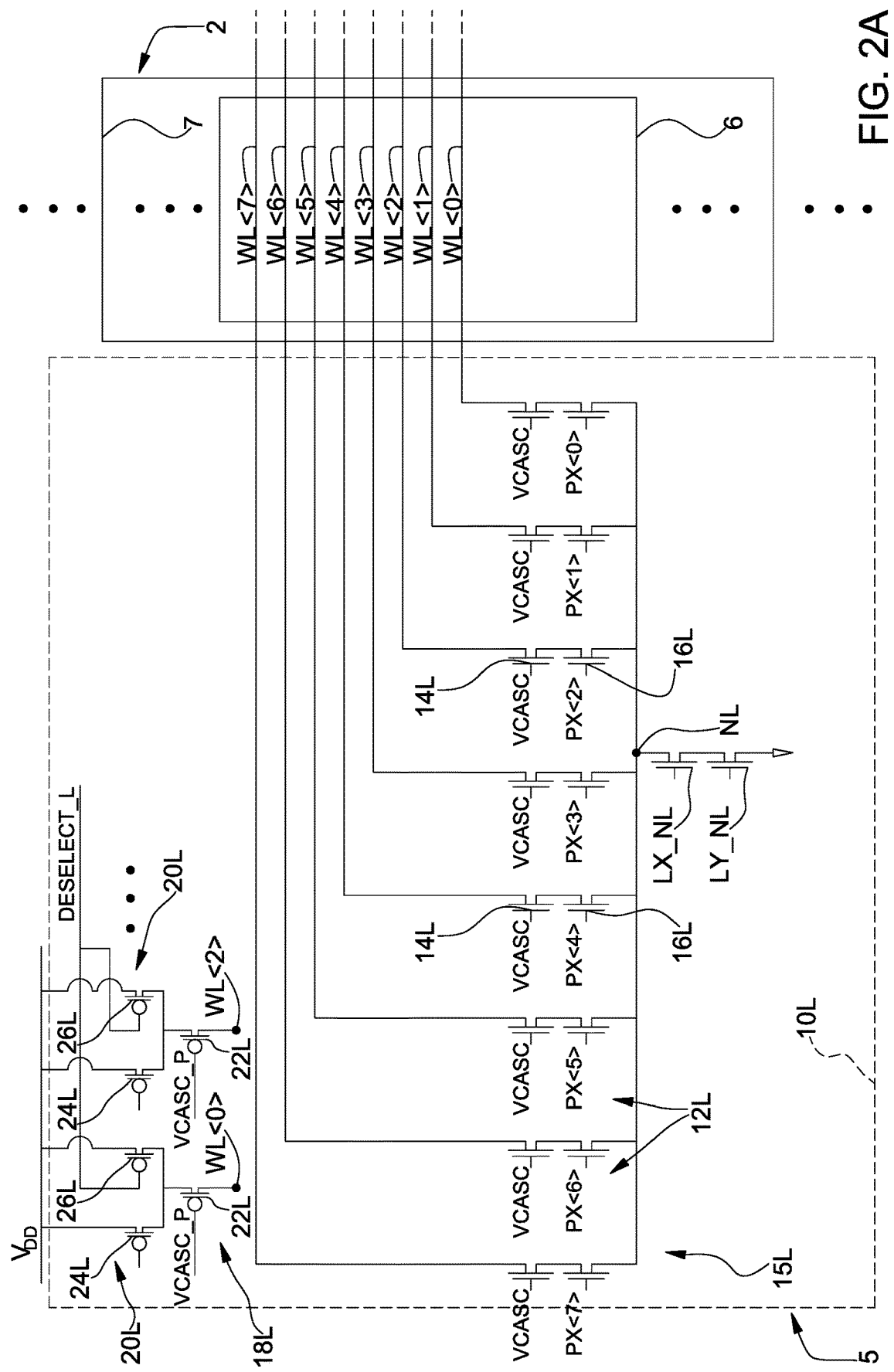
FIGS. 2A and 2B show portions of a same circuit diagram of a row decoder of a known type.
Figure 2B:
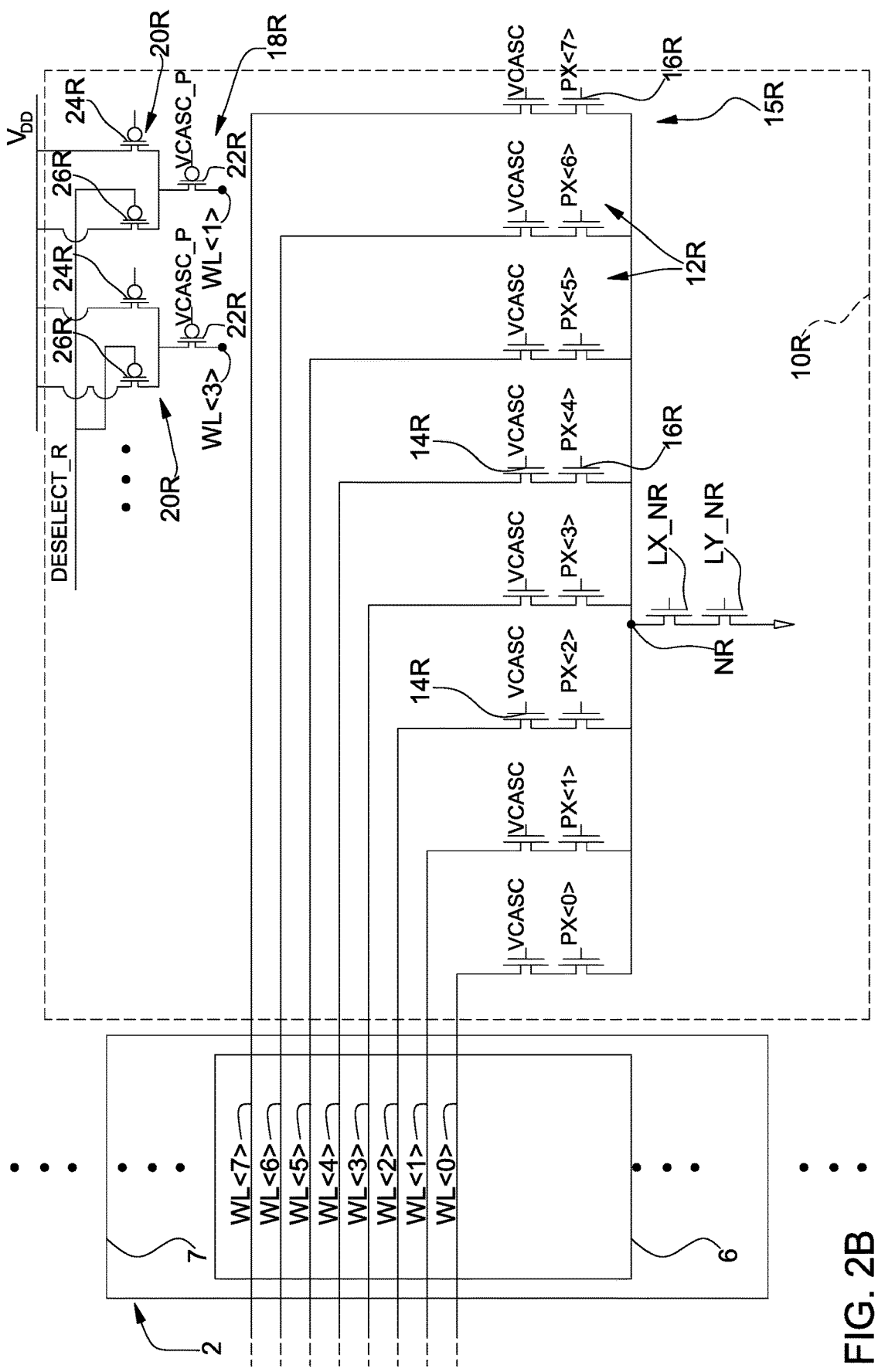
Figure 3:
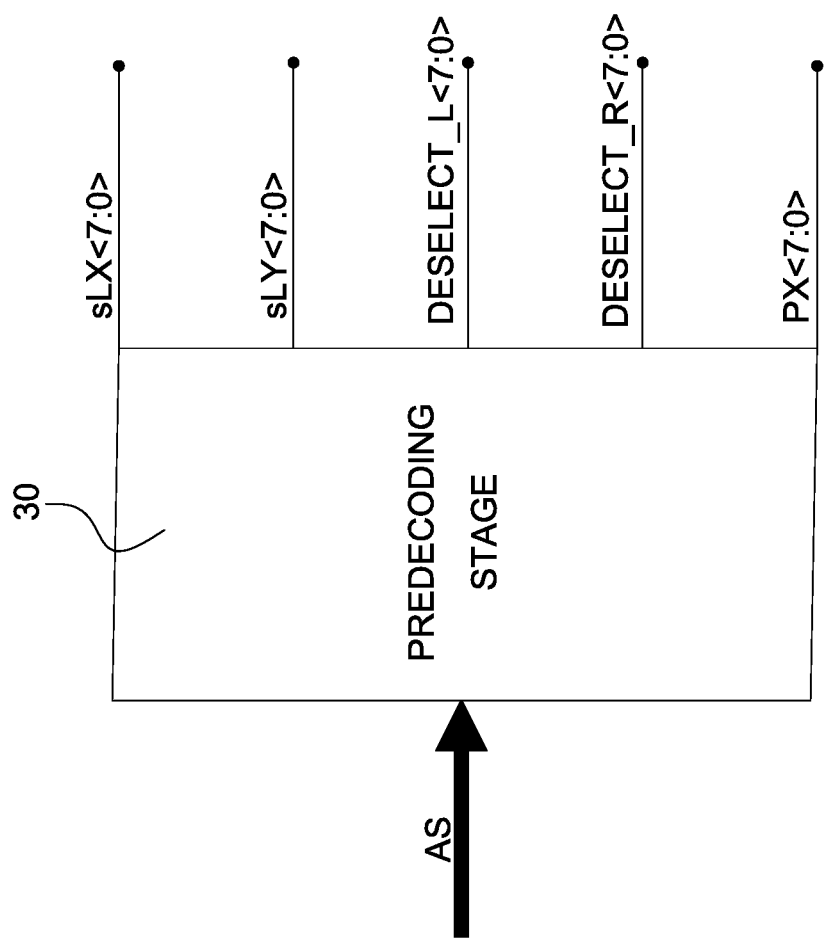
FIG. 3 shows a block diagram of a portion of a row decoder.
Figure 4A:
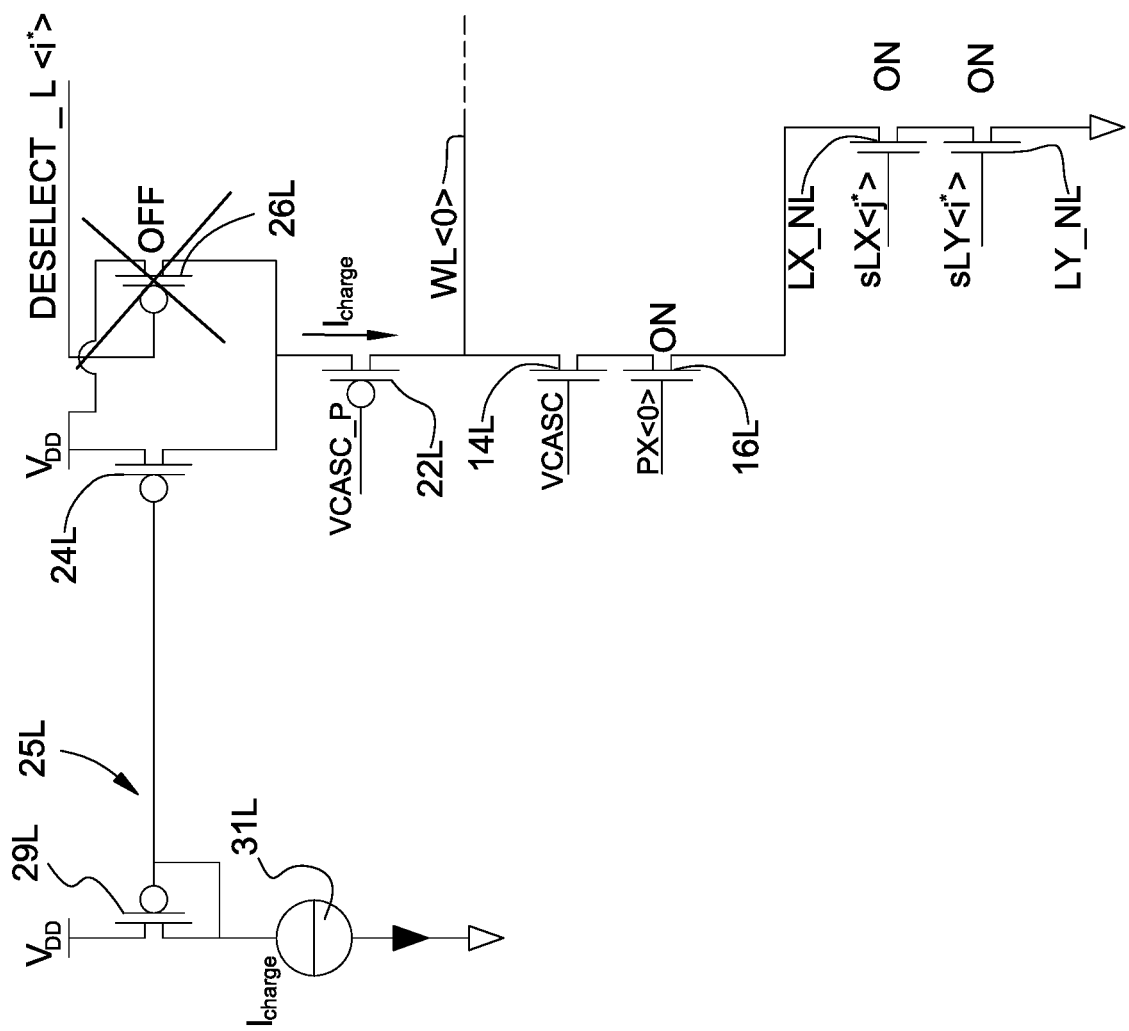
FIGS. 4A and 4B show circuit diagrams of portions of the row decoder represented in FIGS. 2A and 2B.
Figure 4B:
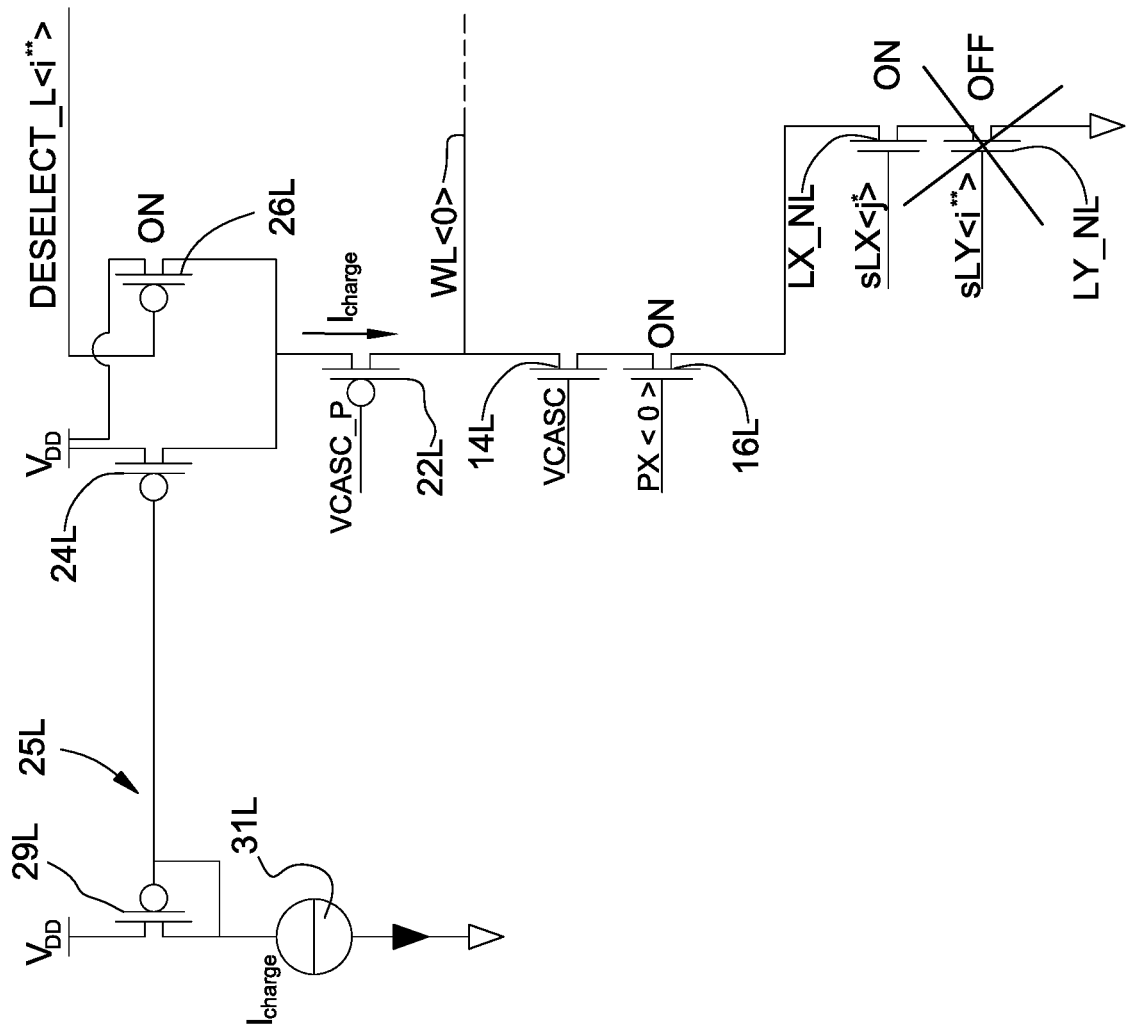

In use, each control circuit 199 receives from the pre-decoding stage 30 the signals sLX, sLY, and PX (generated as described with reference to FIGS. 2A and 2B; the pre-decoding stage 30 does not generate, instead, the signals DESELECT). In this connection, considering any subarray 106 of any one of the first and second right-hand memory arrays 102A_R, 102B_R and of the first and second left-hand memory arrays 102A_L, 102B_L, the corresponding right-hand and left-hand local selection stages 110R, 110L are driven by the decoding stage 30 in the same way as described with reference to FIGS. 2A and 2B. Moreover, the right-hand and left-hand local selection stages 110R, 110L of the first and second right-hand memory arrays 102A_R, 102B_R and of the first and second left-hand memory arrays 102A_L, 102B_L receive the same signals sLX, sLY, and PX.

In addition, each control circuit 199 generates a respective signal Vcomm<n>, which is applied to the gate terminals of the respective left-hand deselection transistor 126L and of the respective right-hand deselection transistor 126R. In other words, each central pull-up circuit 120 forms a pair of pull-up switching circuits, which control a corresponding left-hand word line WL_sx and a corresponding right-hand word line WL_dx, respectively, which are driven in the same way.

In what follows, considering the symmetry of the non-volatile memory device 100 and for reasons of simplicity, selection/deselection of just the right-hand word lines WL_dx is described, with reference to what is shown in FIG. 7. Moreover, except where otherwise specified, in what follows reference is made to a generic subarray 106 of a generic group 107 of the first right-hand memory array 102A_R, which is, for example, coupled to the first left-hand and right-hand pre-selection transistors LY_NL, LY_NR driven by the signal sLY<0> and to the second left-hand and right-hand pre-selection transistors LX_NL, LX_NR driven by the signal sLX<0>. Once again with reference to FIG. 7, designated, respectively, therein by $E_{sx}$ and $E_{dx}$ are two points arranged at the ends of the portion of each right-hand word line WL_dx that traverses the first right-hand memory array 102A_R, respectively connected to which are the corresponding left-hand decoding branch 112L of the left-hand pull-down stage 115L (in particular, the drain terminal of the corresponding left-hand bottom cascode transistor 114L) and the corresponding right-hand decoding branch 112R of the right-hand pull-down stage 115R (in particular, the drain terminal of the corresponding right-hand bottom cascode transistor 114R). In what follows, the points $E_{sx}$ and $E_{dx}$ are referred to, respectively, as left-hand point $E_{sx}$ and right-hand point $E_{dx}$. Moreover, the left-hand point $E_{sx}$ is closer to the central deselection stage 118 than the right-hand point $E_{dx}$.

In practice, considering a portion of right-hand word line WL_dx comprised between the respective left-hand point $E_{sx}$ and the respective right-hand point $E_{dx}$, the corresponding right-hand decoding branch 112R and the corresponding left-hand decoding branch 112L are arranged in a symmetrical way with respect to the portion and function as pull-down switching circuits, which enable coupling/decoupling, respectively, of the right-hand point $E_{dx}$ to/from the right-hand common node NR and of the left-hand point $E_{sx}$ to/from the left-hand common node NL. In addition, the left-hand point $E_{sx}$ is connected to the drain terminal of the right-hand top cascode transistor 122R of the corresponding central pull-up circuit 120.

Albeit not shown in detail, the same considerations apply to the left-hand word lines WL_sx and the corresponding couplings with the left-hand decoding branches 112L of the left-hand pull-down stages 115L and the right-hand decoding branches 115R of the right-hand pull-down stages 115R. In this case, referring as an example to the first left-hand memory array 102A_L, and if denoted by right-hand point $E_{dx}$ and left-hand point $E_{sx}$ are the ends (respectively close to and further away from the central deselection stage 118, as may be seen in FIG. 6, where for simplicity of representation the pull-down stages are not represented) of the portion of each left-hand word line WL_sx that traverses the first left-hand memory array 102A_L, the right-hand point $E_{dx}$ is connected to the drain terminal of the left-hand top cascode transistor 122L of the corresponding central pull-up circuit 120.

For completeness, FIG. 6 moreover shows, for each right-hand word line WL_dx, a corresponding additional left-hand point $E_{sx}'$ and a corresponding additional right-hand point $E_{dx}'$, which delimit the portion of the right-hand word line WL_dx that traverses the second right-hand memory array 102B_R and are respectively coupled to the corresponding left-hand decoding branch 112L (not shown in FIG. 6) and to the corresponding right-hand decoding branch 112R (not shown in FIG. 6). The additional left-hand point $E_{sx}'$ electrically coincides with the right-hand point $E_{dx}$ of the right-hand word line WL_dx.

Once again with reference to the control circuit 199 that drives the n-th right-hand word line WL_dx<n> of a generic subarray 106 of a generic group 107 of the first right-hand memory array 102A_R, this sets the signal Vcomm<n> at a high logic value (equal, for example, to 1.8 V in the reading step and to 4.8 V in the writing step) if the pre-decoding stage 30 indicates, through the signals sLX, sLY, and PX, selection of the n-th right-hand word line WL_dx<n>. In this way, the right-hand deselection transistor 126R is inhibited, and the n-th right-hand word line WL_dx<n> is decoupled from the supply node $V_{DD}$, discharging to ground through the respective left-hand decoding branch 112L and the respective right-hand decoding branch 115R, as described with reference to FIGS. 2A and 2B.

In the case where, instead, the pre-decoding stage 30 indicates, through the signals sLX, sLY, and PX, deselection of the n-th right-hand word line WL_dx<n>, the corresponding control circuit 199 sets the signal Vcomm<n> at a low logic value (for example, equal to 0 V in the reading step and to 2.4 V in the writing step). In this way, the right-hand deselection transistor 126R is brought into conduction and the n-th right-hand word line WL_dx<n> is coupled to the supply node $V_{DD}$, so as to be charged. In this case, the right-hand word line WL_dx<n> is decoupled from ground, as described with reference to FIGS. 2A and 2B.

In greater detail, both charging (in the case of deselection) and discharging (in the case of selection) involve the entire right-hand word line WL_dx<n>, i.e., both the portion of the n-th right-hand word line WL_dx<n> that traverses the first right-hand memory array 102A_R and the portion that traverses the second right-hand memory array 102B_R. In fact, as mentioned previously, the right-hand and left-hand local selection stages 110R, 110L of the first and second right-hand memory arrays 102A_R, 102B_R are driven all in the same way. Consequently, in the case of selection, the additional left-hand point $E_{sx}'$ and the additional right-hand point $E_{dx}'$ of the right-hand word line WL_dx<n> are connected to ground, respectively through the corresponding left-hand decoding branch 112L and the corresponding right-hand decoding branch 112R; moreover, in the case of deselection, the aforementioned additional left-hand point $E_{sx}'$ and additional right-hand point $E_{dx}'$ are decoupled from ground. The same considerations apply to the left-hand word lines WL_sx.

In the case of selection of the right-hand word line WL_dx<n>, the column decoder 4 can therefore enable reading in parallel of memory cells 3 coupled to the right-hand word line WL_dx<n> and belonging to the first and/or second right-hand memory arrays 102B_R. More in general, since, as mentioned previously, the right-hand and left-hand local selection stages 110R, 110L of the first and second right-hand memory arrays 102A_R, 102B_R and of the first and second left-hand memory arrays 102A_L, 102B_L receive the same signals sLX, sLY, and PX, and the control circuits 199 drive the corresponding left-hand and right-hand word lines WL_sx, WL_dx in the same way, the column decoder 4 can enable reading in parallel of memory cells 3 of the first and/or second right-hand memory arrays 102A_R, 102B_R coupled to the right-hand word line WL_dx<n> and of memory cells 3 of the first and/or second left-hand memory arrays 102A_L, 102B_L coupled to the left-hand word line WL_sx<n>.

Figure 8:
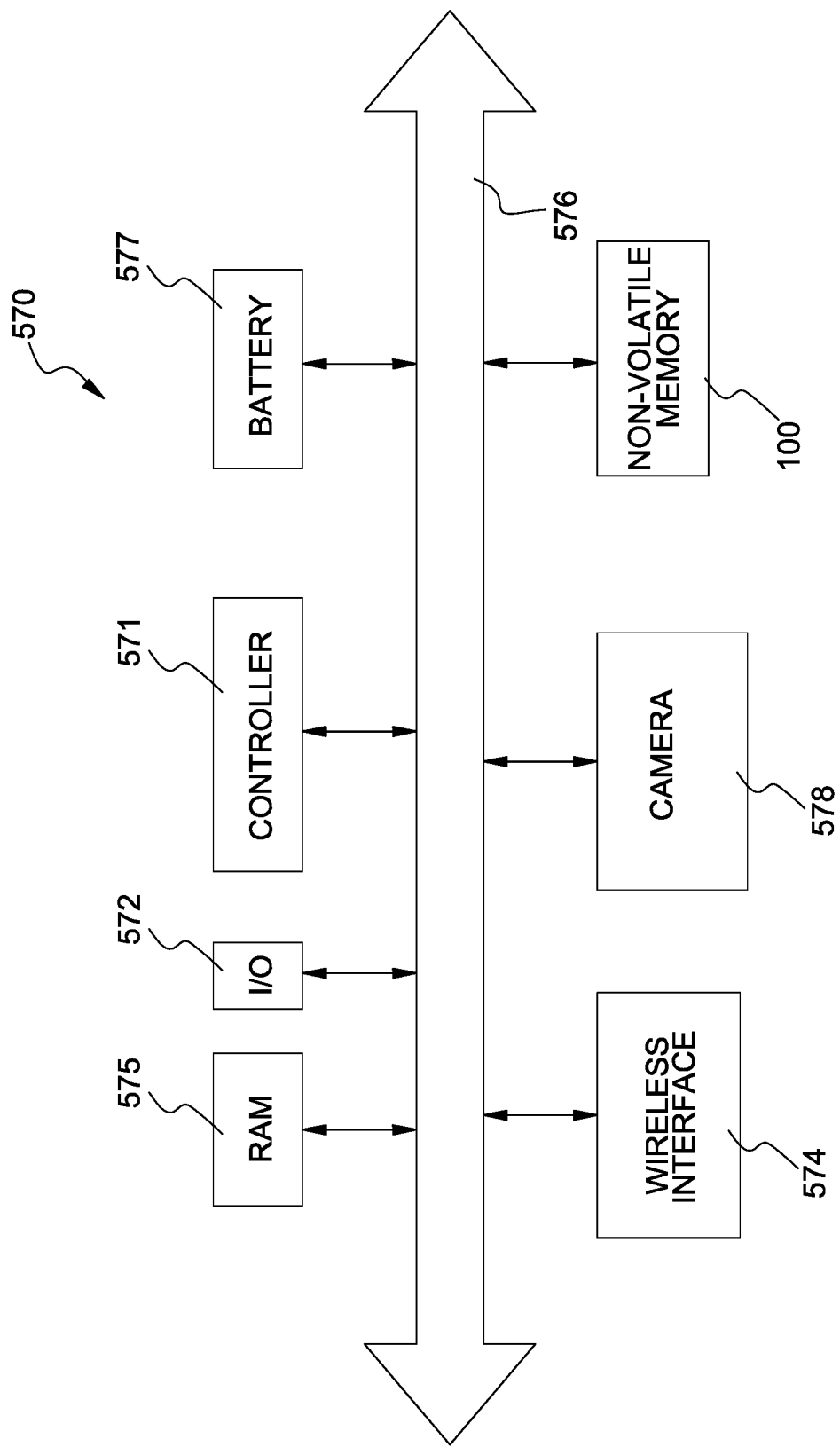
FIG. 8 shows a block diagram of an electronic apparatus that incorporates the present memory device.

For practical purposes, the non-volatile memory device 100 can find use in numerous applications. For instance, FIG. 8 illustrates a portion of an electronic apparatus 570, which may, for example, be: a PDA (Personal Digital Assistant); a portable or fixed computer, possibly with wireless data-transfer capacity; a mobile phone; a digital audio player; a photographic camera or a camcorder; or further devices capable of processing, storing, transmitting, and receiving information.

In detail, the electronic apparatus 570 comprises: a controller 571 (for example, provided with a microprocessor, a DSP, or a microcontroller); an input/output device 572 (for example, provided with a keypad and a display), for input and display of the data; the non-volatile memory device 100; a wireless interface 574, for example an antenna, for transmitting and receiving data through a radio-frequency wireless communication network; and a RAM 575. All the components of the electronic apparatus 570 are coupled through a bus 576. It is possible to use a battery 577 as electrical supply source in the electronic apparatus 570, which can moreover be provided with a photographic camera or a video camera 578. Furthermore, the controller 571 can control the non-volatile memory device 100, for example by co-operating with the control logic CL.

The advantages that the present row decoder affords emerge clearly from the foregoing description. In particular, the present asymmetrical decoder enables reduction of the area used, without penalizing the quality of selection of the word lines. It therefore finds a particularly advantageous use in the case of memory devices with active-line consumption, i.e., where the word lines, when selected, are traversed by current.

Finally, it is clear that modifications and variations may be made to what has been described and illustrated herein, without thereby departing from the scope of the present invention, as defined in the annexed claims.

For instance, the memory cells may be of a type different from what has been described. In particular, the access element 3b may be of a type different from what has been described; for example, it may be a MOSFET. On the other hand, the access element 3b may even be absent, as for example in the case of a so-called non-volatile memory device of a flash type.

It is moreover possible for the memory device wo to comprise a different number and/or a different arrangement of the memory arrays. Moreover, the scheme of hierarchical selection of the subarrays 106 may be different from what has been described.

What is claimed is:

1. A non-volatile memory device comprising:
   at least one first array of memory cells, arranged in rows and coupled to first word lines; and
   a row decoder comprising first and second pull-down stages, which are arranged on opposite sides of the first array and include, respectively, for each first word line, a corresponding first pull-down switching circuit and a corresponding second pull-down switching circuit, which are coupled to a first point and a second point, respectively, of the first word line;
   wherein the first pull-down switching circuit is electronically controllable to:
      couple the first point to a corresponding first node in a selection of the first word line; and
      decouple the first point from the corresponding first node in a deselection of the first word line;
   wherein the second pull-down switching circuit is electronically controllable to:
      couple the second point to a corresponding second node in the selection of the first word line; and
      decouple the second point from the corresponding second node in the deselection of the first word line; and
   wherein the row decoder further comprises a pull-up stage, which includes, for each first word line, a corresponding first pull-up switching circuit, which is electronically controllable to:
      couple the first point of the first word line to a supply node in the deselection of the first word line; and
      decouple the first point of the first word line from the supply node in the selection of the first word line.

2. The memory device according to claim 1, further comprising:
   a second array of memory cells, arranged in rows and coupled to second word lines;
   wherein the row decoder further comprises first and second additional pull-down switching circuits, which are arranged on opposite sides of the second array, and include, respectively, for each second word line, a corresponding first additional pull-down switching circuit and a corresponding second additional pull-down switching circuit, which are respectively coupled to a first point and a second point of the second word line;
   wherein the first additional pull-down switching circuit is electronically controllable to:
      couple the corresponding first point of the second word line to a corresponding first additional node in a selection of the second word line; and
      decouple the corresponding first point of the second word line from the corresponding first additional node in a deselection of the second word line;
   wherein the second additional pull-down switching circuit is electronically controllable to:
      couple the corresponding second point of the second word line to a corresponding second additional node in the selection of the second word line; and
      decouple the corresponding second point of the second word line from the corresponding second additional node in the deselection of the second word line; and
   wherein the pull-up stage further comprises, for each second word line, a corresponding second pull-up switching circuit, which is electronically controllable to, alternatively:
      couple the first point of the second word line to the supply node in the deselection of the second word line; and
      decouple the first point of the second word line from the supply node in the selection of the second word line.

3. The memory device according to claim 2, wherein the pull-up stage is interposed between the first and second arrays.

4. The memory device according to claim 3, further comprising:
   an external array of memory cells, arranged in rows and coupled to the first word lines, wherein the first array is interposed between the pull-up stage and the external array;
   wherein the row decoder further comprises first and second external pull-down switching circuits, which are arranged on opposite sides of the external array, and include, respectively, for each first word line, a corresponding first external pull-down switching circuit and a corresponding second external pull-down switching circuit, which are, respectively, coupled to a first additional point and a second additional point of the first word line;
   wherein the first external pull-down switching circuit is electronically controllable to:

couple the corresponding first additional point to a corresponding first external node in the selection of the first word line; and decouple the corresponding first additional point from the corresponding first external node in a deselection of the first word line; and wherein the second external pull-down switching circuit is electronically controllable to:

couple the corresponding second additional point to a corresponding second external node in the selection of the first word line; and decouple the corresponding second additional point from the corresponding second external node in the deselection of the first word line.

5. The memory device according to claim 2, further comprising:

a control stage configured to select one of the first word lines and to deselect the first word lines other than the first word line selected, wherein the control stage moreover is configured to:

control the first and second pull-down switching circuits corresponding to the selected first word line to couple the first and second points of the selected first word line to the corresponding first node and, respectively, to the corresponding second node, and to control the first pull-up switching circuit corresponding to the selected first word line to decouple the first point of the selected first word line from the supply node; and for each deselected first word line, control the first and second pull-down switching circuits corresponding to the deselected first word line to decouple the first and second points of the deselected first word line from the corresponding first node and, respectively, from the corresponding second node, and to control the first pull-up switching circuit corresponding to the deselected first word line to couple the first point of the deselected first word line to the supply node.

6. The memory device according to claim 5, wherein the control stage is moreover configured to select one of the second word lines and to deselect the second word lines other than the second word line selected, and wherein the control stage moreover is configured to:

control the first and second additional pull-down switching circuits corresponding to the selected second word line to couple the first and second points of the selected second word line to the corresponding first additional node and to the corresponding second additional node, respectively, and to control the second pull-up switching circuit corresponding to the selected second word line to decouple the first point of the selected second word line from the supply node; and for each deselected second word line, control the first and second additional pull-down switching circuits corresponding to the deselected second word line to decouple the first and second points of the deselected second word line from the corresponding first additional node and from the corresponding second additional node, respectively, and to control the second pull-up switching circuit corresponding to the deselected second word line to couple the first point of the deselected second word line to the supply node.

7. The memory device according to claim 2, wherein the first array is divided into subarrays;

wherein the first nodes corresponding to the first word lines of each subarray electrically coincide with a corresponding first common node;

wherein the second nodes corresponding to the first word lines of each subarray electrically coincide with a corresponding second common node;

wherein the first and second pull-down switching circuits comprise, respectively, for each subarray, a first subarray-selection circuit and a second subarray-selection circuit;

wherein the first subarray-selection circuit is interposed between the first common node and a node at a reference potential and is controllable to couple the first common node to the node at the reference potential; and wherein the second subarray-selection circuit is interposed between the second common node and the node at the reference potential and is controllable to couple the second common node to the node at the reference potential.

8. The memory device according to claim 7, further comprising:

a control stage configured to select one of the first word lines and to deselect the first word lines other than the first word line selected, wherein the control stage moreover is configured to:

control the first and second pull-down switching circuits corresponding to the selected first word line to couple the first and second points of the selected first word line to the corresponding first node and, respectively, to the corresponding second node, and to control the first pull-up switching circuit corresponding to the selected first word line to decouple the first point of the selected first word line from the supply node;

for each deselected first word line, control the first and second pull-down switching circuits corresponding to the deselected first word line to decouple the first and second points of the deselected first word line from the corresponding first node and, respectively, from the corresponding second node, and to control the first pull-up switching circuit corresponding to the deselected first word line to couple the first point of the deselected first word line to the supply node;

control the first and second subarray-selection circuits that correspond to the subarray including the selected first word line to couple the corresponding first and second common nodes to the node at the reference potential; and control the first and second subarray-selection circuits that correspond to each subarray other than the subarray including the selected first word line to decouple the corresponding first and second common nodes from the node at the reference potential.

9. The memory device according to claim 1, wherein each memory cell comprises a respective selector and respective phase-change element.

10. The memory device according to claim 9, wherein the respective selector comprises a bipolar transistor.

11. An electronic apparatus comprising:

a controller;

a bus coupled to the controller; and a non-volatile memory device communicatively coupled to the controller via the bus, the non-volatile memory device comprising:

at least one first array of memory cells, arranged in rows and coupled to first word lines; and a row decoder comprising first and second pull-down stages, which are arranged on opposite sides of the first array and include, respectively, for each first word line, a corresponding first pull-down switching circuit and a corresponding second pull-down switching circuit, which are coupled to a first point and a second point, respectively, of the first word line;

wherein the first pull-down switching circuit is electronically controllable to:
couple the first point to a corresponding first node in a selection of the first word line; and
decouple the first point from the corresponding first node in a deselection of the first word line;

wherein the second pull-down switching circuit is electronically controllable to:
couple the second point to a corresponding second node in the selection of the first word line; and
decouple the second point from the corresponding second node in the deselection of the first word line; and wherein the row decoder further comprises a pull-up stage, which includes, for each first word line, a corresponding first pull-up switching circuit, which is electronically controllable to:
couple the first point of the first word line to a supply node in the deselection of the first word line; and
decouple the first point of the first word line from the supply node in the selection of the first word line.

12. The electronic apparatus according to claim 11, wherein the non-volatile memory device further comprises:
a second array of memory cells, arranged in rows and coupled to second word lines;
wherein the row decoder further comprises first and second additional pull-down switching circuits, which are arranged on opposite sides of the second array, and include, respectively, for each second word line, a corresponding first additional pull-down switching circuit and a corresponding second additional pull-down switching circuit, which are respectively coupled to a first point and a second point of the second word line;
wherein the first additional pull-down switching circuit is electronically controllable to:
couple the corresponding first point of the second word line to a corresponding first additional node in a selection of the second word line; and
decouple the corresponding first point of the second word line from the corresponding first additional node in a deselection of the second word line;
wherein the second additional pull-down switching circuit is electronically controllable to:
couple the corresponding second point of the second word line to a corresponding second additional node in the selection of the second word line; and
decouple the corresponding second point of the second word line from the corresponding second additional node in the deselection of the second word line; and
wherein the pull-up stage further comprises, for each second word line, a corresponding second pull-up switching circuit, which is electronically controllable to, alternatively:
couple the first point of the second word line to the supply node in the deselection of the second word line; and
decouple the first point of the second word line from the supply node in the selection of the second word line.

13. The electronic apparatus according to claim 12, wherein the pull-up stage is interposed between the first and second arrays.

14. The electronic apparatus according to claim 13, wherein the non-volatile memory device further comprises:
an external array of memory cells, arranged in rows and coupled to the first word lines, wherein the first array is interposed between the pull-up stage and the external array;
wherein the row decoder further comprises first and second external pull-down switching circuits, which are arranged on opposite sides of the external array, and include, respectively, for each first word line, a corresponding first external pull-down switching circuit and a corresponding second external pull-down switching circuit, which are, respectively, coupled to a first additional point and a second additional point of the first word line;
wherein the first external pull-down switching circuit is electronically controllable to:
couple the corresponding first additional point to a corresponding first external node in the selection of the first word line; and
decouple the corresponding first additional point from the corresponding first external node in a deselection of the first word line; and
wherein the second external pull-down switching circuit is electronically controllable to:
couple the corresponding second additional point to a corresponding second external node in the selection of the first word line; and
decouple the corresponding second additional point from the corresponding second external node in the deselection of the first word line.

15. The electronic apparatus according to claim 12, wherein the non-volatile memory device further comprises:
a control stage configured to select one of the first word lines and to deselect the first word lines other than the first word line selected, wherein the control stage moreover is configured to:
control the first and second pull-down switching circuits corresponding to the selected first word line to couple the first and second points of the selected first word line to the corresponding first node and, respectively, to the corresponding second node, and to control the first pull-up switching circuit corresponding to the selected first word line to decouple the first point of the selected first word line from the supply node; and
for each deselected first word line, control the first and second pull-down switching circuits corresponding to the deselected first word line to decouple the first and second points of the deselected first word line from the corresponding first node and, respectively, from the corresponding second node, and to control the first pull-up switching circuit corresponding to the deselected first word line to couple the first point of the deselected first word line to the supply node.

16. The electronic apparatus according to claim 15, wherein the control stage is moreover configured to select one of the second word lines and to deselect the second word lines other than the second word line selected, and wherein the control stage moreover is configured to:
control the first and second additional pull-down switching circuits corresponding to the selected second word line to couple the first and second points of the selected second word line to the corresponding first additional node and to the corresponding second additional node, respectively, and to control the second pull-up switching circuit corresponding to the selected second word line to decouple the first point of the selected second word line from the supply node; and for each deselected second word line, control the first and second additional pull-down switching circuits corresponding to the deselected second word line to decouple the first and second points of the deselected second word line from the corresponding first additional node and from the corresponding second additional node, respectively, and to control the second pull-up switching circuit corresponding to the deselected second word line to couple the first point of the deselected second word line to the supply node.

17. A method for selecting word lines of a non-volatile memory device comprising a first array of memory cells, arranged in rows and coupled to first word lines, and a row decoder comprising first and second pull-down stages, which are arranged on opposite sides of the first array, and include, respectively, for each first word line, a corresponding first pull-down switching circuit and a corresponding second pull-down switching circuit, which are coupled, respectively, to a first point and a second point of the first word line;

the first pull-down switching circuit being electronically controllable to:
couple the first point to a corresponding first node; or else
decouple the first point from the corresponding first node;

the second pull-down switching circuit being electronically controllable to:
couple the second point to a corresponding second node; or else
decouple the second point from the corresponding second node; and the row decoder further comprising a pull-up stage, which includes, for each first word line, a corresponding first pull-up switching circuit, which is electronically controllable to:
couple the first point of the first word line to a supply node; or else
decouple the first point of the first word line from the supply node;

the method comprising selecting a first word line, which selecting comprises:
controlling the first and second pull-down switching circuits corresponding to the selected first word line to couple the first and second points of the selected first word line to the corresponding first node and to the corresponding second node, respectively; and
controlling the first pull-up switching circuit corresponding to the selected first word line to decouple the first point of the selected first word line from the supply node; and the method further comprising deselecting the first word line, which deselecting comprises:
controlling the first and second pull-down switching circuits corresponding to the deselected first word line to decouple the first and second points of the selected first word line from the corresponding first node and from the corresponding second node, respectively; and
controlling the first pull-up switching circuit corresponding to the deselected first word line to couple the first point of the deselected first word line to the supply node.

18. The method according to claim 17, wherein the non-volatile memory device further comprises a second array of memory cells, arranged in rows and coupled to second word lines, the row decoder further comprises first and second additional pull-down switching circuits, which are arranged on opposite sides of the second array, and include, respectively, for each second word line, a corresponding first additional pull-down switching circuit and a corresponding second additional pull-down switching circuit, which are coupled, respectively, to a first point and a second point of the second word line;

the first additional pull-down switching circuit being electronically controllable to:
couple the corresponding first point to a corresponding first additional node; or else
decouple the corresponding first point from the corresponding first additional node;

the second additional pull-down switching circuit being electronically controlled to:
couple the corresponding second point to a corresponding second additional node; or else
decouple the corresponding second point from the corresponding second additional node; and the pull-up stage further comprising, for each second word line, a corresponding second pull-up switching circuit, which is electronically controllable to:
couple the first point of the second word line to the supply node; or else
decouple the first point of the second word line from the supply node;

the method further comprising selecting a second word line, which selecting comprises:
controlling the first and second additional pull-down switching circuits corresponding to the selected second word line to couple the first and second points of the selected second word line to the corresponding first additional node and to the corresponding second additional node, respectively; and
controlling the second pull-up switching circuit corresponding to the selected second word line to decouple the first point of the selected second word line from the supply node; and the method further comprising deselecting the second word line, which deselecting comprises:
controlling the first and second additional pull-down switching circuits corresponding to the deselected second word line to decouple the first and second points of the deselected second word line from the corresponding first additional node and from the corresponding second additional node, respectively; and
controlling the second pull-up switching circuit corresponding to the deselected second word line to couple the first point of the deselected second word line to the supply node.

19. The method according to claim 18, wherein the non-volatile memory device further comprises an external array of memory cells, arranged in rows and coupled to the first word lines, the first array being interposed between the pull-up stage and the external array, the row decoder further comprising first and second external pull-down switching circuits, which are arranged on opposite sides of the external array, and including, respectively, for each first word line, a corresponding first external pull-down switching circuit and a corresponding second external pull-down switching circuit, which are coupled, respectively, to a first additional point and a second additional point of the first word line;

the first external pull-down switching circuit being electronically controllable to:

couple the corresponding first additional point to a corresponding first external node; or else decouple the corresponding first additional point from the corresponding first external node, the second external pull-down switching circuit being electronically controllable to:

couple the corresponding second additional point to a corresponding second external node; or else decouple the corresponding second additional point from the corresponding second external node;

the selecting the first word line further comprising:

controlling the first and second external pull-down switching circuits corresponding to the selected first word line to couple the corresponding first and second additional points to the corresponding first external node and to the corresponding second external node, respectively; and the deselecting the first word line further comprising:

controlling the first and second external pull-down switching circuits corresponding to the selected first word line to decouple the corresponding first and second additional points from the corresponding first external node and from the corresponding second external node, respectively.

20. The method according to claim 17, wherein the first array is divided into subarrays, the first nodes corresponding to the first word lines of each subarray electrically coincide with a corresponding first common node, the second nodes corresponding to the first word lines of each subarray electrically coincide with a corresponding second common node, the first and second pull-down switching circuits comprise respectively, for each subarray, a first subarray-selection circuit and a second subarray-selection circuit, the first subarray-selection circuit being interposed between the first common node and a node at a reference potential and is controllable to couple the first common node to the node at the reference potential, and the second subarray-selection circuit being interposed between the second common node and the node at the reference potential and being controllable to couple the second common node to the node at the reference potential;

the selecting the first word line further comprising:

controlling the first and second subarray-selection circuits that correspond to the subarray including the selected first word line to couple the corresponding first and second common nodes to the node at the reference potential; and the deselecting the first word line further comprising:

controlling the first and second subarray-selection circuits that correspond to the subarray including the deselected first word line to decouple the corresponding first and second common nodes from the node at the reference potential.

* * * * *